United States Patent
Jue

(10) Patent No.: US 7,224,241 B2
(45) Date of Patent: May 29, 2007

(54) EXTENDED MATCHING RANGE TUNER

(76) Inventor: Martin F. Jue, 500 Canterbury Rd., Starkville, MS (US) 39759

( * ) Notice: Subject to any disclaimer, the term of this patent is extended or adjusted under 35 U.S.C. 154(b) by 195 days.

(21) Appl. No.: 11/072,132

(22) Filed: Mar. 4, 2005

(65) Prior Publication Data
US 2006/0197624 A1  Sep. 7, 2006

(51) Int. Cl.
*H03H 7/38* (2006.01)
(52) U.S. Cl. ............................. 333/32; 334/78; 334/83
(58) Field of Classification Search ................. 333/32, 333/126, 17.3; 334/78, 81–83
See application file for complete search history.

(56) References Cited
U.S. PATENT DOCUMENTS
2,551,756 A * 5/1951 Mittelmann .................. 219/666
6,670,864 B2 * 12/2003 Hyvonen et al. ............. 333/32

OTHER PUBLICATIONS

Lewis G. McCoy, "The 50-Ohmer Transmatch," *QST*, American Radio Relay League, Inc., Jul. 1961, p. 30,31,136.
Lewis G. McCoy, "The Ultimate Transmatch," *QST*, American Radio Relay League, Inc., Jul. 1970, p. 24-27, 58.
"The Murch UT-2000 Ultimate Transmatch," *QST*, American Radio Relay League, Inc., Dec. 1972, p. 43.
Ulrich L. Rohde, "Some Ideas On Antenna Couplers," *QST*, American Radio Relay League, Inc., Dec. 1974, p. 48-52.
Circuit diagram for Differential-T™ Tuner, Nov. 21, 2000.

* cited by examiner

*Primary Examiner*—Stephen E. Jones
(74) *Attorney, Agent, or Firm*—Robert K. Tendler

(57) ABSTRACT

In a T network tuner, a variable shunt capacitor is provided between the signal input and ground that is ganged to the variable input matching capacitor. The operation is mechanically arranged such that, as one decreases the capacitance of the variable input matching capacitor, one increases the capacitance of the shunt capacitor to assist in high frequency matching, both to increase the maximum matchable load resistance and to decrease the minimum matchable load resistance. The variable shunt capacitor therefore assists at the high frequency ranges to bring the antenna impedances down to the transmitter output impedance, thus to establish an extended matching range tuner capable working between 160 and 10 meters.

14 Claims, 4 Drawing Sheets

EXTENDED MATCHING RANGE TUNER

FIELD OF THE INVENTION

This invention relates to antenna tuning and more particularly to the use of a variable shunt capacitor coupled to the input matching capacitor in a T network such that when the variable input matching capacitor is tuned to reduce its capacitance, the capacitance of the shunt capacitor is increased.

BACKGROUND OF THE INVENTION

As is well known, tuners between a transmitter and an antenna are used to match the antenna impedance to the impedance at the output of a transmitter. In amateur radio service, for instance, one is seeking to match antennas to transmitters in various bands, for instance, from 160 meters through 10 meters. When using a T network, while a variable input matching capacitor can be utilized for matching an antenna to the 50-ohm output of a transmitter at the low frequency bands, when trying to use the same circuit to tune 10-meter antennas, even when the variable input matching capacitor is completely open, there is nonetheless a minimum capacitance between the plates of the open variable capacitor. Because of the minimum capacitance, if for instance an antenna has an impedance of 1,000 ohms, its impedance may only be reduced to 100 ohms. There is thus a mismatch between the output impedance of the transmitter and that of the antenna that increases the standing wave ratio.

It has been found that shunting the tuner input to ground through a capacitor is effective in reducing the mismatch, for instance, from 100 ohms down to 50 ohms. However, if one is using a fixed shunt capacitor, the capacitor must have an extremely high current rating, for instance as high as 10 amps or more for continuous high power applications such as associated with AM and RTTY transmission. While 3 KV capacitors have been used in tuners and are satisfactory for low duty cycle use such as for high power CW and SSB transmissions, they oftentimes fail and burn up, especially when used with 1500-watt PEP linear amplifiers.

By way of further background, antenna tuners in the 1940s and 1950s used so-called link-coupled antenna tuners. However, in order to obtain appropriate matching range, these tuners involved clipping wires to the various components and moving jumpers around, making them inconvenient to use. One therefore had to actually change the configuration of the circuit to work with different kinds of antenna impedances.

Collins Radio in the 1930s and 1940s developed what has become known as their Pi network. The Pi network has an advantage because three controls are used to match most antennas to the output impedance of a transmitter. The Pi networks typically use two large variable capacitors and a variable inductor in which the variable inductor could either be a switched inductor or a continuously variable inductor.

One of the problems of the Pi network was that it took an exceedingly large amount of capacitance, namely several thousand picofarads of capacitance, in order to match certain antennas. Moreover, while the Pi network was very convenient, a single-ended Pi network did not work with balanced lines unless one used a balun. Even then, the result was non-optimal.

During this time and even prior to the development of the Pi network, L networks were used for antenna tuning. They were not particularly popular and were troublesome to use because in order to match a high impedance, one had to have one configuration, whereas if one wished to match a low impedance, one had to switch to a different configuration. One would then have to go through a tuning procedure each time the configuration was switched.

Moreover, the L networks required large amounts of capacitance, which could be as much as 5,000-picofarads. With smaller common air variable capacitors, one would nonetheless have to switch in many fixed capacitors. Moreover, if one had a variable capacitor that was as large as 5,000 picofarads, then one would have to slowly and carefully open that capacitor in order to fine-tune the match because of the large change in capacitance per degree of rotation. However, the minimum capacitance might be so high that it would not tune a wide range of impedances on the highest frequency band of interest.

In terms of amateur radio frequency bands, one wishes to be able to tune from approximately 1.8 MHz to 30 MHz. The problem is that if one makes an L network perform well on the low frequency bands, namely 160 meters, then one has problems matching antennas at the higher frequency bands, especially at 10 meters.

The reason for the difficulty in matching antennas at the high frequency end is because of the minimum capacitance of the variable capacitor. If one designs a variable capacitor to work well on 10 meters, then it will not work very well on 160 meters. This is because one needs large amounts of capacitance when tuning on 160 meters. One typically achieves such high capacitance by switching in additional capacitance with an expensive switch.

As to shunt capacitors, in the past, various systems have employed variable capacitors such as in the semi-T network antenna tuner described by Lewis G. McCoy in the Jul. 1970 issue of QST published by the American Radio Relay League. McCoy called his antenna tuner the Ultimate Transmatch, which employed two capacitors ganged together, with the input signal from the transmitter coupled to the junction between the two capacitors. One of the variable capacitors ran from the transmitter to ground, whereas the other variable capacitor ran from the transmitter to the ungrounded end of the inductor and in the semi-T network.

It is not clear what the McCoy shunt capacitor accomplished and it was dropped in later T-network tuners.

The variable shunt capacitor in the McCoy tuner did not, however, function to extend the matching range of the antenna tuner. The reason was simply that, as the variable input matching capacitor had its capacitance decreased, so did the capacitance associated with the shunt capacitance. This decreased capacitance did not address the minimum capacitance problem that limits the matching range of a T-type tuner.

Note that a commercial version of the McCoy tuner, namely the MURCH UT-2000, is described in QST, Dec. 1972, American Radio Relay League.

As has been stated above, the McCoy tuner has been referred to as a semi-T network antenna tuner. The semi-T network antenna tuner of McCoy worked relatively well and served the basis for the evolution of the modem T network that uses an inductor and two capacitors, a input matching capacitor and an output matching capacitor.

However, in the evolution of the T network, instead of having to provide 1,000 picofarads or even 500 picofarads of capacitance, it was found that one could use common 250-picofarad variable capacitors with a variable inductor and match an extremely wide range of impedances. With 250-picofarad variable capacitors, one can achieve exceptional performance on 10 meters while achieving adequate performance at 160 meters, for instance, at 1.8 MHz. The problem is the efficiency at 1.8 MHz, which is poor because one loses a great deal of power in the antenna tuner.

The reason that the performance is poor on 160 meters is that use of the tuner at 1.8 MHz forces a high current through the roller inductor as well as applying a large voltage across the roller and across the capacitor. This results in a lot of losses in the roller inductor. Also the large voltage applied across the matching capacitors tends to cause high voltage arcing in the capacitors.

More importantly, because the value of the variable capacitor is small, namely 250 picofarads, when one opens the capacitor up, the minimum capacitance is also small. This allows one to readily tune in the 10-meter band. However, at 1.8 MHz, because of the low capacitance the efficiency is so bad for low impedance loads that one could potentially lose half of the power in the antenna tuner.

One way to alleviate this problem at 160 meters is to use a very large value for the input matching capacitor so a very large value output matching capacitor can be used. If one uses a 500-picofarad or 1,000-picofarad variable capacitor, then the losses for low impedance loads at 1.8 MHz are minimized and one can readily match low to very low antenna impedances.

However, when one uses a 1,000-picofarad capacitor and opens it up, the minimum capacitance is now high. In fact, the capacitance is so high that one cannot tune a high-impedance load on 10 meters. Thus, by enabling the tuner to work at 160 meters, one has effectively eliminated its performance at 10 meters. In short, if one wants to have high efficiency at 160 meters, the tuner hardly works at all on 10 meters.

In order to extend the high-impedance matching range of a T network tuner, MFJ Enterprises, Inc. of Starkville, Miss. produced a tuner in which a fixed shunt capacitor was connected between the transmitter and ground at the input to the tuner to solve the problem of the high minimum capacitance at the higher frequencies. This capacitor was three 33-picofarad 3-KV high voltage capacitors in parallel. While this capacitor was suitable for some low duty cycle transmissions such as CW and SSB, for continuous use the currents through this capacitor were exceedingly high and could, for a 1.5-kilowatt amplifier, result in 10 amps or more of current through the fixed capacitor, which could destroy it.

Thus these fixed capacitors could burn up in continuous use and sometimes with heavy CW or SSB use. The result of such large amounts of current through the fixed capacitor would be that it would burn holes through the capacitor and the capacitor would catch fire. The reason that these fixed capacitors are not suitable for high-current usage is that the dielectric between the two plates can melt or burn.

Another problem with the fixed shunt capacitor occurs in the high frequency range when a low impedance load is to be matched. Here the fixed shunt capacitor reduces the effective capacitance of the input matching capacitor. In order for the input matching capacitor to perform it must increase its capacitance. However, the fixed shunt capacitor counters this.

Note that in T and L networks one can utilize a small shunt coil to put a reactance across the input to extend the low impedance matching range on 160 meters. The problem with such a solution is that while on 160 meters the coil could be effective, for other bands one would have to switch in different shunt coils.

SUMMARY OF INVENTION

Rather than using a high-voltage fixed shunt capacitor between the input to the tuner and ground for a T network tuner, in the subject invention one uses a variable air gap capacitor that is ganged to the input matching capacitor. The salient feature of the subject invention is that as one decreases the capacitance of the input matching capacitor, one increases the shunt capacitance to ground. This results in an extremely broadbanded tuner that can work from 160 meters to 10 meters and provide exceptional matching regardless of antenna impedance.

Thus, for instance, at 10 meters, when for high impedance loads one wishes to solve the problem of the minimum capacitance of the input matching capacitor, one relies on the increased capacitance of the variable shunt capacitor. For exceptionally low load impedances the shunt is removed from the circuit so that the input matching capacitor can do its job.

On the other hand, at 160 meters, when the input matching capacitor is almost fully engaged, the shunt capacitor is almost fully disengaged so that it is not effectively in the circuit. This means that the tuner can be maximized for the lower frequencies since the input matching capacitor can be designed for the lower frequencies.

Thus, for the higher frequencies, when the minimum capacitance of the variable input matching capacitor is not low enough, one is able to further lower this minimum capacitance problem by using a variable shunt capacitor that increases its capacitance as one decreases the capacitance of the input matching capacitor. On the other hand, at the higher frequencies when the load impedance is lower, unless one can remove the shunt capacitance the maximum effective input matching capacitance will be limited which limits the lowest load impedance that can be matched. However, since the shunt capacitance goes down when the input matching capacitance goes up to take care of the lower impedance, it will not impede the input matching capacitor and it can perform its matching function.

In one embodiment, this ganged capacitance arrangement is provided by a simple variable capacitor assembly in which, for the larger input matching capacitor, one has a large number of primary stator plates that interact with the rotor plates as the rotor plates are rotated into the stators. However, one provides the assembly with a reduced number of secondary stator plates rotated 180 degrees away from the position of the primary stator plates, with rotor plates for the secondary capacitor attached to the same shaft and aligned with the primary rotor plates.

The result is that, as one rotates the rotor plates into the primary stators, one simultaneously rotates the rotor plates out of the secondary capacitor stators and vice versa. What this means is that, as one reduces the engagement of the rotor plates of the primary variable capacitor, one increases the engagement of the rotor plates associated with the secondary capacitor stator plates. Thus in the tuner, what one does is to increase the shunt capacitance while reducing the capacitance of the input matching capacitor.

Another way to increase the capacitance of one capacitor while simultaneously decreasing the capacitance of another capacitor is simply to gang the two capacitors together with a mechanical linkage such that, as the plates in one of the capacitors engage the associated stators, the plates in the other capacitor disengage due to the mechanical linkage.

In one operative example, assume that one is seeking to match 300 ohms of antenna impedance to 50 ohms of transmitter output impedance for a given input matching capacitor value. By increasing the shunt capacitance one can, for instance, match 50 ohms to 5,000 ohms. In order to do this, one might have to generate 100 picofarads or more of shunt capacitance in the input matching capacitor to achieve a matching range of, for instance, 2,000 to 3,000 ohms.

Note that the purpose of any tuner is to take advantage of the maximum power transfer theorem in order to transfer maximum power. The impedance of the source must be equal to the complex conjugate of the load. In other words, they both need to have the same resistive value. It is therefore the purpose of the antenna tuner to transform the impedance of the antenna down to the 50-ohm purely resistive value, which is the normal output impedance of a transmitter.

It will be appreciated that with the aforementioned fixed shunt capacitor, at the higher frequencies the shunt capacitor is more of a short, whereas at the lower frequencies, for instance at 1.8 MHz, the capacitor has almost no effect. Thus, it automatically switches itself out as one goes lower in frequency.

While in the past it was possible to provide a high-voltage, high-current fixed capacitor and take advantage of the fact that it automatically switched itself out at lower frequencies, in the subject invention one does not have to add a separate fixed capacitor. One merely has to build in a variable shunt capacitor into the variable input matching capacitor assembly such that, as one needs to tune higher impedances at the higher frequencies, the shunt capacitor becomes larger and larger.

Note in the subject invention that the stator plates for the shunt capacitor are insulated from the stator plates for the input matching capacitor. This can be accomplished using fiberglass ends for the variable capacitor assembly, which function as insulators.

In summary, in a T network tuner, one uses a variable shunt capacitor between the signal input and ground that is ganged to the variable input matching capacitor. The operation is mechanically arranged such that, as one decreases the capacitance of the variable input matching capacitor, one increases the capacitance of the shunt capacitor to assist in high frequency matching. The tunable shunt capacitor therefore assists at the high frequency ranges to bring the antenna impedance down to the transmitter output impedance, thus to establish an extended matching range tuner capable of a 1:15 bandwidth.

BRIEF DESCRIPTION OF THE DRAWINGS

These and other features of the subject invention will be better understood in connection with a Detailed Description, in conjunction with the Drawings, of which.

DETAILED DESCRIPTION

Figure 1:
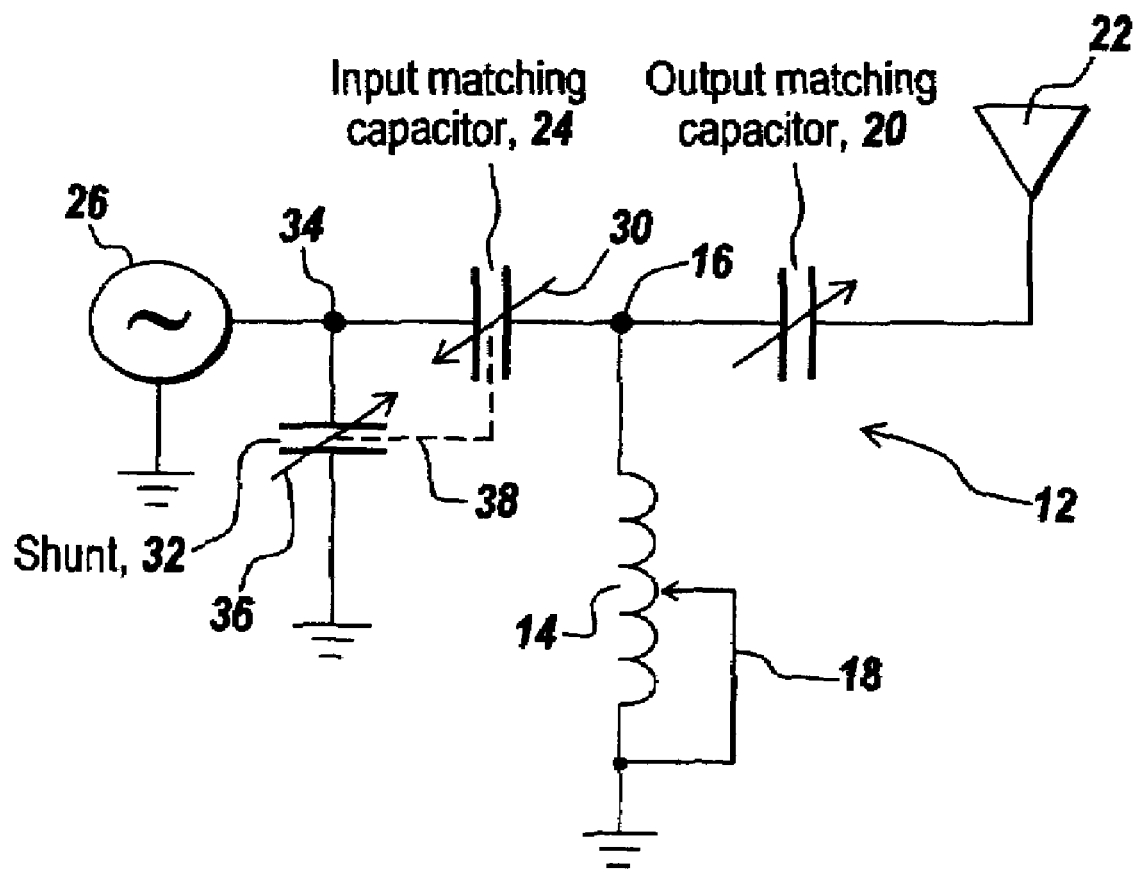
FIG. 1 is a schematic diagram of the subject circuit in which a T network tuner is modified by providing a shunt capacitance to ground at the signal input and in which the shunt capacitor is a variable capacitor that is ganged with the variable input matching capacitor such that, as the capacitance of the input matching capacitor is decreased, the capacitance of the shunt capacitor is increased.

Referring now to FIG. 1, a T network antenna tuner 12 has a tapped or variable inductor 14 connected between ground and a point 16. Inductor 14 is provided with a tap 18 so that the inductance can be readily varied.

A variable output matching capacitor 20 is coupled between point 16 and antenna 22, whereas a variable input matching capacitor 24 is connected between point 16 and a signal source 26. Signal source 26 is typically a transmitter having an output impedance of 50 ohms. Capacitor 24 has an arrow 30 going down through it and pointing downwardly to the left, whereas a shunt capacitor 32 connected between signal source input 34 and ground has an arrow 36 pointed in a direction opposite to arrow 30. As can be seen by dotted line 38, the two capacitors, namely capacitor 24 and capacitor 32, are ganged together or arranged such that decreasing the capacitance of capacitor 24 results in increasing the capacitance of capacitor 32. The increased shunt capacitance assists matching the higher frequencies.

In operation, when tuning to the higher frequencies, capacitor 24 is adjusted to a point of minimum capacitance. If this minimum capacitance cannot result in a match of the antenna 22 impedance to the output impedance of source 26, then the failure of the minimum capacitance of capacitor 30 to provide a match is solved by the increase in capacitance of shunt capacitor 32.

What this means is that, for the lower frequency portion of the band where a fair amount of capacitance is used in order to effectuate a match as provided by capacitor 24, shunt capacitor 32 is basically out of the circuit because its capacitance is reduced to its minimum.

For the higher frequency bands, capacitor 24 is set to its minimum capacitance, which at the same time results in shunt capacitor 32 being at its maximum capacitance. The maximum capacitance of shunt capacitor 32 causes the tuner to be able to bring the impedance at point 34 down to the output impedance of signal source 26, thus to effectuate a match on the higher frequency bands.

The result of providing a mechanical air gap variable capacitor as a shunt capacitor eliminates the high current problems associated with fixed capacitors. As a result, there is no possibility of burnout or damage to the shunt capacitor dielectric due to the 100% duty cycles associated with AM broadcasts and RTTY, while at the same time permitting the tuner to operate and match at the higher frequency bands.

As to the lower frequency bands, capacitor 24 can be provided with a large capacitance of 500 to 1000 picofarads or more, which is suitable for matching at frequencies, for instance, as low as 1.8 MHz.

What is therefore accomplished is a wideband extended matching range tuner that is effective both at the low frequency end of the spectrum, namely at, for instance, 160 meters, while it is equally effective at the high frequency end of the spectrum due to the maximally-engaged shunt capacitor that comes into play when the input matching capacitor is rotated such that its rotor plates are out from between its stator plates.

How the shunt capacitor operates will be discussed hereinafter in connection with FIG. 4.

Figure 2:
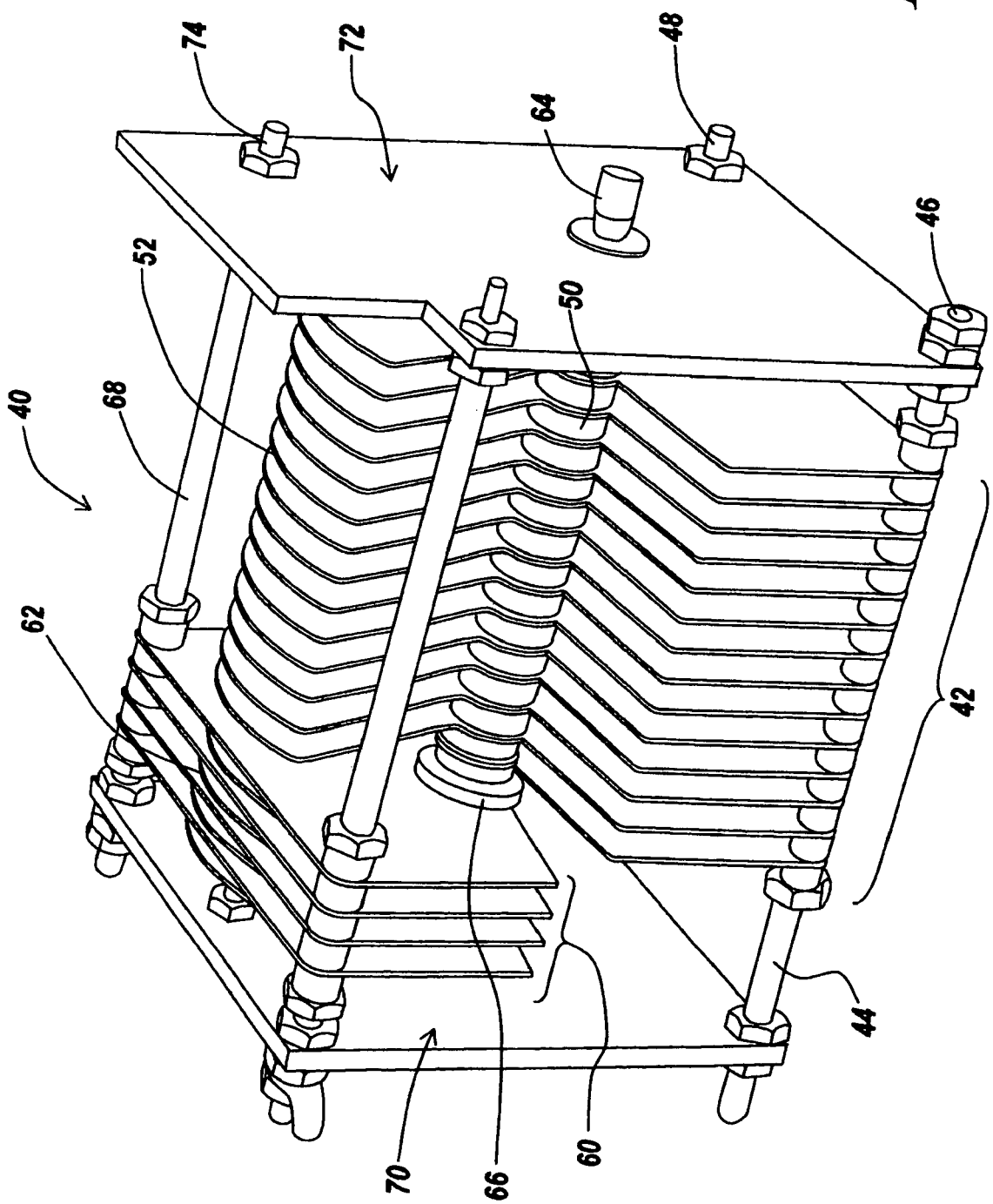
FIG. 2 is a diagrammatic illustration of a variable capacitor assembly housing two variable capacitors in which one section has stator plates to one side of a rotor and in which a second section has stator plates to the opposite side of the rotor, with the rotor plates fully engaging the shunt capacitor stator plates when the rotor plates associated with the input matching capacitor are rotated to an open position.

Referring now to FIG. 2, a capacitor assembly 40 is arranged so as to have upstanding stator plates 42 interconnected at their bases along conductive rods 44 and 48, with rod 44 having a connector 46 at one end.

A rotor 50 is employed in the mechanical tuning of this capacitor assembly such that rotating rotor 50 rotates rotor plates 52 into the spaces between stator plates 42 so as to either increase or decrease the capacitance associated with this variable air gap capacitor.

In order to achieve the ganged performance of the input matching and shunt capacitors of FIG. 1, a series of stator plates 60 are located diametrically opposite stator plates 42. Rotor plates 62 are rotatable to be positioned between stator plates 60, with rotor plates 62 being attached to rotor 50. Note that rotor 50 also has a connector at one end, here illustrated by reference character 64.

Stator plates 60 are supported in the assembly by conductor rods 66 and 68 such that these plates depend downwardly towards rotor 50, as opposed to the stator plates 42 extending upwardly towards rotor 50.

Because end plates 70 and 72 of the capacitor assembly are insulators, the stator plates that extend upwardly are insulated from the stator plates that depend downwardly.

Note that a connector 74 is connected to the end of rod 68 so that connection can be made to the downwardly-depending stator plates.

The upwardly-extending stator plates are those associated with input matching capacitor 24 of FIG. 1, whereas the downwardly-depending stator plates 60 are associated with shunt capacitor 32 in this figure.

With this in mind, the ungrounded output of signal source 26 is connected to rotor 64, whereas connector 46 of the capacitor assembly of FIG. 2 is connected to point 16 in FIG. 1. Additionally, connector 74 is connected to ground such that the connection of the capacitor assembly of FIG. 2 is connected as shown in FIG. 1.

Figure 3:
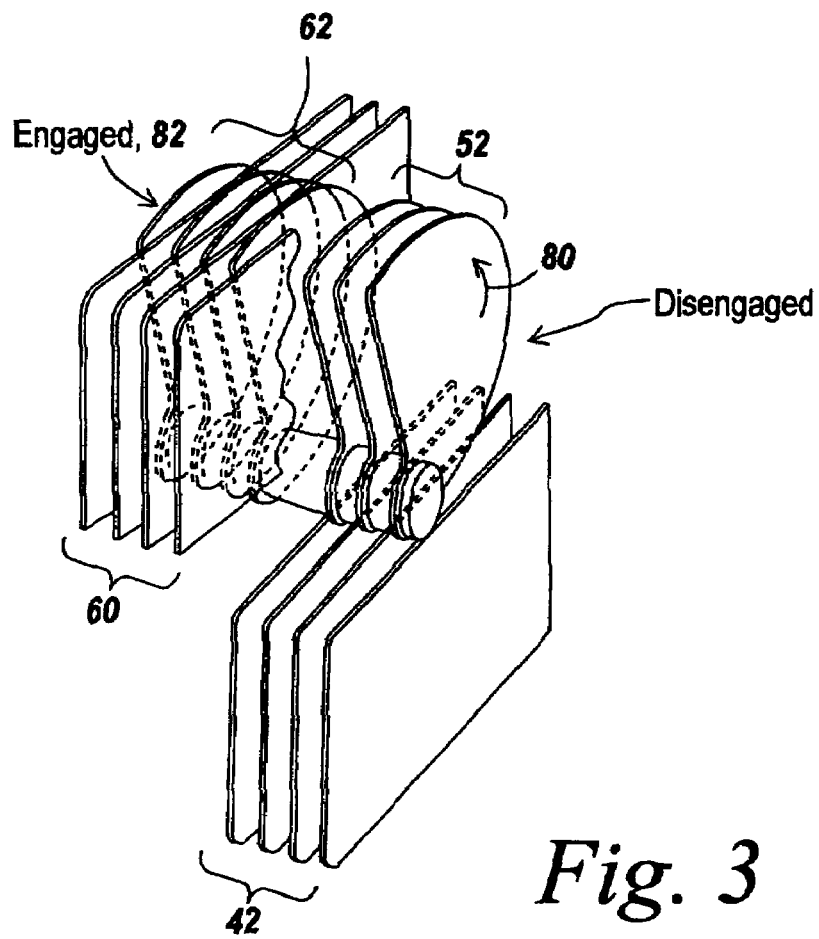
FIG. 3 is a diagrammatic illustration of the operation of the variable capacitor assembly of FIG. 2, illustrating the condition in which the rotor plates associated with the input matching capacitor are rotated out from between the associated stator plates, where the rotor plates associated with the shunt capacitor are simultaneously rotated into engagement with the shunt capacitor stator plates.

In operation and referring now to FIG. 3, as can be seen, rotor plates 52 are shown rotated in the direction of arrow 80 out from between stator plates 42 such that when rotated sufficiently far, rotor plates 52 come completely out of the spaces between stator plates 42.

Simultaneously, rotor plates 62 of the shunt capacitor are shown as illustrated at 82 to be fully engaged with stator plates 60, thus to provide maximum capacitance while the input matching capacitor is exhibiting minimum capacitance.

Whether it is because of the natural operation of a shunt capacitor across the input in which the capacitor is essentially open at the lower frequencies and closed at the upper frequencies, or whether it is by virtue of the fact of the increased engagement of the shunt capacitor rotor plates when tuning the upper frequencies, the net result is the same.

The unitary capacitor assembly that houses the two capacitors provides an exceedingly mechanically simple and stable high current device. This two-capacitor device operates to provide enough capacitance for the input matching capacitor to tune antennas at the lower frequency bands with the engagement of plates 52 with plates 42, while at the same time providing that the capacitor defined by plates 60 and 62 have virtually no effect in these lower frequency bands, while providing the requisite shunt capacitance at the high frequencies.

Figure 4:
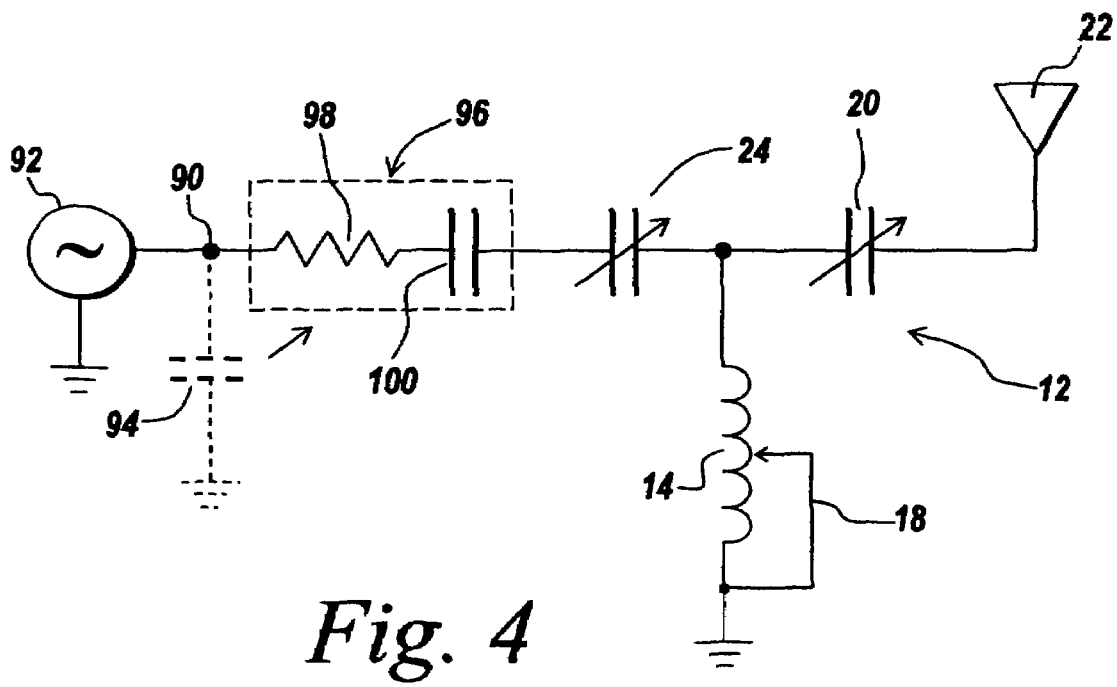
FIG. 4 is a schematic diagram of an equivalent circuit to the shunted input circuit of FIG. 1, showing that interposing the shunt capacitor results in further lowering of the minimum capacitance of the input matching capacitor; and, FIG. 5 is a graph showing the maximum load resistance versus capacitance for the input matching capacitor of a T network for a fixed value of output matching capacitance, showing capacitance versus load for the case where there is no capacitor shunt and the cases where either a variable capacitor shunt or a fixed capacitor shunt is used.

Referring now to FIG. 4, what is shown is the effect at the higher frequencies of providing a shunt capacitor across an input 90 to ground from a signal source 92. The shunt capacitor here shown in dotted outline at 94 and the signal source resistance 92 can be characterized as a series-connected RC circuit illustrated in dotted box 96, composed of a resistor 98 and a capacitor 100.

Assuming that input matching capacitor 24 is at minimum capacitance, the effect of shunt capacitor 94 is to place capacitor 100 in series with capacitor 24. This further reduces the equivalent minimum capacitance associated with capacitor 24. The result is that one can obtain excellent matching at the higher frequencies for high antenna impedance by solving the minimum capacitance problem.

However, at the higher frequencies, for instance at 10 meters, a fixed shunt capacitance would have a deleterious effect if the antenna load impedance is low.

When the antenna impedance is low, to achieve a match one would have to increase the capacitance of input matching capacitor 24 for a given value of output matching capacitor 20. As an example, if the antenna impedance were 25 ohms and the output matching capacitor 20 was set at 200 pf, the input matching capacitor 24 must be set to a high value of 412 pf for a match to occur at 10 meters.

If, as in the past, shunt capacitor 94 were a fixed 100 picofarads, capacitor 24 could have trouble achieving the match for a fixed value of capacitor 20 because at the lower antenna impedances capacitor 100 would be in series with capacitor 24. This would lower the capacitance of capacitor 24 in a situation where one wants to have a higher capacitance for the input matching to occur.

THE VARIABLE CAPACITOR

The provision of a variable capacitor whose capacitance is inverse to the capacitance of the input matching capacitor operates in two ways. At the higher frequencies, for high impedance loads the more engaged variable shunt capacitor aids in reducing the minimum capacitance which extends the maximum high impedance matching range. Secondly, for low impedance loads, when capacitor 24 is adjusted for more capacitance, shunt capacitor 94 is adjusted for less capacitance and therefore does not take away from the effective capacitance of the input matching capacitor which could limit the low impedance matching range. Thus in both cases the tuner is able to achieve a match regardless of the antenna impedance.

In summary, rather than providing a fixed shunt capacitor at the input to ground that adversely affects tuning at the higher frequencies for low impedance loads, since the capacitance of capacitor 94 is reduced to a very low value for low impedance loads, the input matching capacitor is effective to match such low impedance loads.

Thus, for the higher frequencies, while one could potentially substitute a fixed air gap capacitor to achieve better matching with high impedance loads, the use of the subject variable capacitor not only achieves excellent matching for high impedance loads by further reducing the minimum capacitance of the input matching capacitor, it also achieves excellent matching for low impedance loads by removing itself from the circuit, thus to allow the input matching capacitor to match the low impedance load.

What is therefore been provided is a convenient, unitary, simple assembly that offers the heretofore-elusive broadband performance to T-type antenna tuners. It also extends the high impedance matching range at high frequencies of high pass L networks because the T network becomes a L network when the output matching capacitor becomes very large or infinite.

While it will be appreciated that the above invention has been described in terms of a variable shunt capacitor that employs air gaps between rotor plates and stator plates, it is possible to use a fixed high current air gap capacitor as a shunt.

Figure 5:
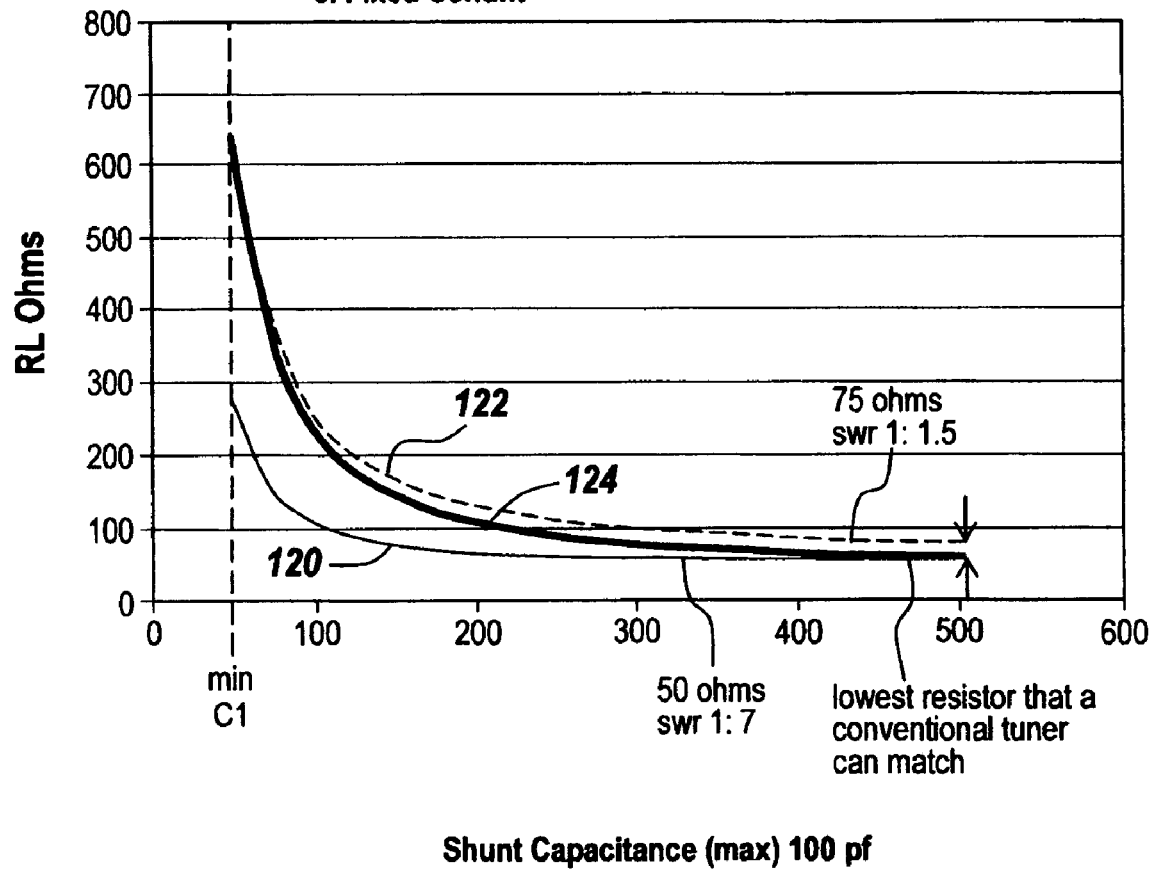

Referring now to FIG. 5, what is shown is the effect of providing a shunt capacitor across an input matching capacitor for a T network in which the shunt capacitor is either fixed or variable. The curve labeled 120 illustrates that for the case in which no shunt capacitance is used, the maximum load resistance matchable is less than 300 ohms when $C_1$, the capacitance of the variable input matching capacitor, is at its minimum point and the variable output matching capacitor C2 is at maximum.

As shown by curve 122, when using a fixed shunt capacitor at 100 pf, the maximum load resistance matchable at $C_1$ min and C2 max is close to 700 ohms. This means that using a shunt capacitor increases the maximum matchable load resistance. However, the lowest resistance that can be matched is 75 ohms. When one is seeking to match a 75-ohm load to a 50-ohm source, the SWR is an undesirable 1:1.5.

As can be seen by curve 124 corresponding to a variable capacitance shunt, the maximum load resistance matchable is likewise close to 700 ohms for $C_1$ min and C2 max. However, because the shunt capacitance is variable and decreases with an increase in the capacitance of the input matching capacitor, the lowest resistance that can be matched is now 50 ohms, i.e., the lowest resistance that a conventional tuner can match.

What can be seen is that the introduction of either a fixed shunt or a variable capacitance shunt greatly improves the maximum resistance load that a T network tuner can match for $C_1$ min.

However, the lowest load impedance matchable when using a fixed shunt is 75 ohms. The result for a fixed shunt is that the best SWR that is achievable is 1:1.5 at the lowest impedance end. By using a variable shunt capacitor, one duplicates the performance of the case in which no shunt is used at the lowest impedance end, since when the capacitance for the input matching capacitor increases, the shunt capacitance decreases to zero. This is because as one increases the capacitance of the input matching capacitor, one simultaneously decreases the shunt capacitance. Therefore, the advantage of using a variable capacitor shunt is that as the capacitance of the input matching capacitor increases, the capacitance at the shunt decreases.

This provides excellent matching for both high and low resistance loads across the entire 10-meter band. Moreover, the use of a shunt capacitance extends the high impedance matching range over the entire 160–10 meter bands, but its effect is less as the frequency is lower.

Noting that in the above example a maximum shut capacitance of 100 pf permits matching to a 700-ohm load, increasing the shunt capacitance to 200 pf expands the top end to 1,500 ohms.

However, if one were to use a 200-pf fixed shunt capacitor, then the minimum matchable load resistance would be 99 ohms or an unacceptable SWR of 2:1.

Thus the use of the variable shunt coupled to the variable input matching capacitor extends the range of the tuner without deleteriously affecting any portion of the tuner's operation.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for extending the matching range of a T-network tuner having variable input and output matching capacitors and an inductor coupled therebetween and to ground, comprising the steps of:
    connecting a variable shunt capacitor between the input end of the input matching capacitor and ground; and,
    driving the variable shunt capacitor such that as the input matching capacitor is adjusted for less capacitance, the capacitance of the variable shunt capacitor is increased, whereby the maximum load resistance that can be matched at minimum input matching capacitor capacitance is increased and whereby the minimum load resistance that can be matched at maximum input matching capacitor capacitance is decreased over that associated with a fixed shunt.

2. The method of claim 1, wherein the driving step includes the step of co-locating two variable capacitors on the same rotary shaft and arranging the stator plates for the two variable capacitors on opposite sides.

3. The method of claim 2, wherein the rotor blades associated with the input matching capacitor are located on the opposite side of the rotary shaft from the rotor blades associated with the variable shunt capacitor.

4. The method of claim 3, wherein the capacitance of the input matching capacitor is greater than that of the shunt capacitor.

5. The method of claim 4, wherein the number of stators and rotary blades associated with the input matching capacitor is greater than the number of stators and rotary blades associated with the variable shunt capacitor.

6. In a T-network tuner having at least a variable input matching capacitor, a method for increasing the matchable resistive load, which decreased matchable resistive load is caused by the minimum capacitance of the input matching capacitor being too high, comprising the step of:
    providing a variable shunt capacitor between the input end of the input matching capacitor and ground.

7. The method of claim 6, wherein the capacitance of the variable shunt capacitor is made to go up when the capacitance of the input matching capacitor goes down.

8. The method of claim 7, wherein the variable shunt capacitor is ganged to the input matching capacitor.

9. The method of claim 8, wherein the variable shunt capacitor and the variable input matching capacitor share the same rotary shaft.

10. The method of claim 9, wherein the respective stators and associated rotor blades of the shunt and input matching capacitors are on opposite sides of the rotary shaft.

11. In a T-network tuner having at least a variable input matching capacitor, a method for decreasing the matchable resistive load over that associated with a fixed shunt capacitor coupled between the input end of the input matching capacitor and ground, comprising the step of:

providing that the fixed shunt capacitor be variable and have a capacitance that goes down when the capacitance of the input matching capacitor goes up.

12. The method of claim 11, wherein the variable shunt capacitor is ganged to the input matching capacitor.

13. The method of claim 12, wherein the variable shunt capacitor and the variable input matching capacitor share the same rotary shaft.

14. The method of claim 13, wherein the respective stators and associated rotor blades of the shunt and input matching capacitors are on opposite sides of the rotary shaft.

* * * * *